(12) United States Patent
Laepple

(10) Patent No.: US 10,031,174 B2
(45) Date of Patent: Jul. 24, 2018

(54) APPARATUS AND METHOD FOR INSULATION TESTING OF AN ELECTRICAL SUPPLY NETWORK

(71) Applicant: Fluke Deutschland GmbH, Glottertal (DE)

(72) Inventor: Klaus Laepple, Glottertal (DE)

(73) Assignee: Fluke Deutschland GmbH, Glottertal (DE)

(*) Notice: Subject to any disclaimer, the term of this patent is extended or adjusted under 35 U.S.C. 154(b) by 772 days.

(21) Appl. No.: 13/830,953

(22) Filed: Mar. 14, 2013

(65) Prior Publication Data
US 2014/0266245 A1   Sep. 18, 2014

(51) Int. Cl.
G01R 31/08 (2006.01)
G01R 27/02 (2006.01)

(52) U.S. Cl.
CPC .......... G01R 31/08 (2013.01); G01R 27/025 (2013.01)

(58) Field of Classification Search
CPC .................................................. G01R 27/025
USPC ................................................ 324/500–559
See application file for complete search history.

(56) References Cited

U.S. PATENT DOCUMENTS

| | | | |
|---|---|---|---|
| 3,986,107 A * | 10/1976 | Dickson | G01R 31/12 324/509 |
| 4,638,242 A | 1/1987 | Matsuno | |
| 5,872,457 A | 2/1999 | Williams | |
| 6,091,591 A * | 7/2000 | Heinz | H02H 3/338 361/42 |
| 2002/0145435 A1 * | 10/2002 | Bald | G01R 31/2849 324/551 |
| 2003/0085711 A1 | 5/2003 | Takagi | |
| 2004/0174173 A1 | 9/2004 | Elms et al. | |

(Continued)

FOREIGN PATENT DOCUMENTS

DE    33 33 098 A1    10/1984
GB    1073189         6/1967
(Continued)

OTHER PUBLICATIONS

ANSI/NETA ATS—2009.*
(Continued)

*Primary Examiner* — Patrick Assouad
*Assistant Examiner* — Khristopher Yodichkas
(74) *Attorney, Agent, or Firm* — Seed IP Law Group LLP

(57) ABSTRACT

An apparatus embodiment comprises a voltage source, a measuring device, a controller, and at least two connecting elements. The connecting elements connect to an electrical supply network comprising at least a phase conductor and a neutral conductor. The voltage source applies at least a first voltage and a second voltage to a pair of the conductors of the electrical supply network. The measuring device measures the resistance between the pair of conductors. The controller compares a first resistance measured by the measuring device between the pair of conductors to a predetermined first threshold resistance value and detects that an electric device is connected to the electrical supply network when the first resistance is lower than or equal to the first threshold. When an electric device is not detected, the controller is further configured to perform a higher voltage insulation test of the electrical supply network.

19 Claims, 1 Drawing Sheet

(56) References Cited

U.S. PATENT DOCUMENTS

| | | | |
|---|---|---|---|
| 2009/0040679 | A1 | 2/2009 | Lauter |
| 2011/0011163 | A1* | 1/2011 | Cote .................. G01M 3/2838 73/40.7 |
| 2011/0271927 | A1 | 11/2011 | Ueno |
| 2012/0105083 | A1* | 5/2012 | Chen .................. G01R 17/105 324/691 |

FOREIGN PATENT DOCUMENTS

| | | |
|---|---|---|
| JP | 53-157782 U | 5/1977 |
| JP | 9-237392 A | 9/1997 |
| JP | 2004-125697 A | 4/2004 |

OTHER PUBLICATIONS

InterNational Electrical Testing Association, "Standard for Acceptance Testing Specifications for Electrical Power Equipment and Systems," ANSI/NETA ATS—2009, p. 38.

Kalous, K., "In Der Praxis Isolations-Messer," Electrotechnik, 53(4):16-19, Feb. 17, 1971.

Kalous, K., "Isolationsmesser für die Überprüfung von Elektroinstallationen und Elektrogeräten," Elektrotechnik, 50(5):21-22, May 22, 1968.

Miller, H.N., "Insulation Resistance and High-Potential Testing: Advantages and Limitations," IEEE Transactions on Industry and General Applications, IGA-5(3):326-332, May/Jun. 1969.

European Search Report dated Jul. 14, 2014, in European Patent Application No. EP 14159803.7, filed Mar. 14, 2014, 9 pages.

Extended European Search Report dated Nov. 24, 2014, issued in corresponding European Patent Application No. 14159803.7, filed Mar. 14, 2014, 16 pages.

Kalous, K., "Isolations-messer," Elektrotechnik 53(4):16-19, Feb. 1971 (See Extended European Search Report dated Nov. 24, 2014.)

Kalous, K., "Isolationsmesser für die Überprüfung von Elektroinstallationen and Elektrogeräten," Elektrotechnik 50(5):21-22, May 1968 (See Extended European Search Report dated Nov. 24, 2014. ).

Miller, H.N., "Insulation Resistance and High-Potential Testing: Advantages and Limitations," IEEE Transactions a on Industry and General Applications IGA-5(3):326-332, May/Jun. 1969.

"Standard for Acceptance Testing Specifications for Electrical Power Equipment and Systems," American National Standard, ANSI/NETA ATS—2009, Chap. 7, "Inspection and Test Procedures," p. 38.

Japanese Office Action, dated Dec. 19, 2017, for Japanese Application No. 2014-040653, 8 pages (with English Translation).

* cited by examiner

APPARATUS AND METHOD FOR INSULATION TESTING OF AN ELECTRICAL SUPPLY NETWORK

FIELD

The present disclosure relates to the testing of insulation of conductors, and in particular to apparatus and methods for testing the insulation of conductors in an electrical supply network. More specifically, the exemplary embodiments of the present disclosure relate to testing the insulation of single-phase and three phase alternating current electrical supply networks.

BACKGROUND

An insulation resistance test typically uses an applied DC voltage to measure the insulation resistance of the conductors of an electrical supply network. Such insulation tests are, for example, necessary to avoid fires caused by faulty wires. Test procedures for insulation tests are defined in various standards, including the ANSI/NETA ATS-2009 standard. This standard provides test procedures and acceptances levels for most types of electrical equipment. According to ANSI/NETA ATS-2009, for electrical supply networks with a nominal voltage of 250V, the minimum test voltage has to be 500V for the insulation test. For different nominal voltages of electrical supply networks, higher or lower test voltages are required.

The insulation resistance for an electrical supply network with a nominal voltage of 250V must be no lower than 500 kΩ. For testing the insulation resistance, the test voltage has to be applied to each pair of conductors of the electrical supply network, e.g., to the phase conductor and the neutral conductor, to the neutral conductor and the protective earth conductor, and to the protective earth conductor and the phase conductor, in a single-phase alternating current electrical supply network. None of these three measured resistances are allowed to be lower than 500 kΩ to pass the insulation resistance test. In most cases, the measured resistances exceed the critical value of 500 kΩ significantly.

The insulation resistance test measurements have to be performed in predetermined time intervals or after modifying the electrical supply networks. Before starting an insulation test, all appliances connected to the electrical supply network must be disconnected. Due to the high test voltage, devices like computers, telephones, or televisions can be destroyed by the test voltage. In addition, appliances connected to an electrical supply network during insulation testing can distort the test results.

In many cases, in particular in offices, an electrician that performs the test may find it difficult to identify all of the appliances connected to the electrical supply network to be tested. Some appliances may be covered by desks, boards, or the like, and are therefore not visible. As a result, in some cases, even if mandatory, the insulation test is not performed because electricians are concerned about destroying appliances. This raises the risk of fires or electric shocks.

It is an objective of the present disclosure to overcome the problem of identifying when appliances are connected to electrical supply networks by providing a technique for testing whether appliances are still connected before performing an insulation test. The present disclosure also provides, in various embodiments, an apparatus and a method for improving insulation testing.

SUMMARY

According to one aspect of the present disclosure, a method is provided to determine whether electric devices, such as appliances, are connected to an electrical supply network. According to at least one embodiment of the present disclosure for testing whether appliances are connected with an electrical supply network, a first voltage is applied between at least one phase conductor and a neutral conductor of the electrical supply network and a first resistance between said phase conductor and the neutral conductor of the electrical supply network is measured. The first voltage could also be applied to the neutral conductor instead to measure the first resistances of said pair of conductors in the alternative. It is preferable to choose the first voltage to be lower than or equal to the operating voltage of the electrical supply network to ensure that after the first voltage is applied none of the appliances that are possibly still connected to the electrical supply network will be damaged.

To identify if any appliances are connected to the supply network, the measured first resistance is compared to a predetermined first threshold resistance value. If the first resistance is lower than or equal to the predetermined first threshold resistance value, it is determined that at least one appliance is connected to the supply network. It can therefore be detected whether appliances are still connected to the supply network. The measured first resistance can be the wire insulation resistance or the resistance of at least one appliance connected to the electrical supply network.

According to at least one embodiment of the present disclosure, it can be advantageous to apply a first voltage, either a DC voltage or an AC voltage, in a range of 20V to 120V to at least a pair of the conductors of the electrical supply network. In various embodiments, the first voltage may be in a range of 30V to 100V, and in some embodiments, a first voltage of approximately 50V is used. Such voltages will not cause any damage to connected appliances with a nominal operating voltage of 120V or more.

According to another embodiment of the present disclosure, the first threshold resistance value may be selected to be in a range of 10 kΩ to 250 kΩ. In various embodiments, the first threshold resistance value may be in a range of 30 kΩ to 100 kΩ, and in some embodiments, the first threshold resistance value may be 50 kΩ. Modern electrical appliances are typically allowed to consume no more than 1 W at standby condition. A power of 1 W results in a load of about 50 kΩ, which is much lower than the required minimum insulation resistance of 500 kΩ.

According to a further embodiment, if an electric appliance is not detected, the insulation resistance test can subsequently be performed. Accordingly, a second voltage may be applied to at least one pair of the conductors of the electrical supply network and a second resistance is measured between the pair of conductors. An insulation weakness of at least one of the conductors can be detected by comparing the second resistance to a predetermined second threshold resistance value, and further determining whether the second resistance is lower than or equal to the predetermined second threshold resistance value.

An advantage of this embodiment of the present disclosure is that the second voltage for determining the insulation resistance of the electrical supply network is applied after the first voltage is applied. According to the ANSI/NETA ATS-2009 standard, the second voltage has to be much higher than the operating voltage of the electrical supply network. According to this embodiment, the second voltage is applied only after it is determined that no appliances are connected to the electrical supply network, and therefore it can be guaranteed that no appliances will be damaged by the second voltage and that the insulation test itself will not be influenced by further appliances.

According to at least one embodiment of the present disclosure, it may be advantageous to apply a second voltage, either a DC voltage or an AC voltage, in a range of 250V to 2500V to at least one a pair of the conductors of the electrical supply network. In various embodiments, the second voltage may be in a range of 250V to 1000V, and in some embodiments, the second voltage may be 500V. Such voltages fulfil the requirements of test voltages according to the ANSI/NETA ATS-2009 standard.

According to another embodiment of the present disclosure, the first threshold resistance value may be selected to be in a range of 500 kΩ to 10 MΩ. In particular, the first threshold resistance value may be 500 kΩ. Such resistance values are the minimum insulation resistance values required for many electrical supply networks.

According to another embodiment of the present disclosure, the second voltage is applied to each pair of the conductors of the electrical supply network and second resistances are measured between each of the pairs of conductors. Any insulation weakness of each of the conductors is detected by comparing if at least one of the second resistances is lower than or equal to the predetermined second threshold resistance value.

According to a further embodiment of the present disclosure, it may be advantageous to display whether an insulation weakness of one of the conductors is detected. It may also be advantageous to display whether an electric device is connected to the electrical supply network.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

While illustrative embodiments are illustrated and described below, it will be appreciated that various changes can be made therein without departing from the spirit and scope of the invention. In that regard, the detailed description set forth below, in connection with the appended drawings where like numerals reference like elements, is intended only as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result.

Embodiments of the present disclosure may be practiced with an apparatus comprising a voltage source, a measuring device, a controller, and connecting elements configured to connect the apparatus to an electrical supply network.

Figure 1:
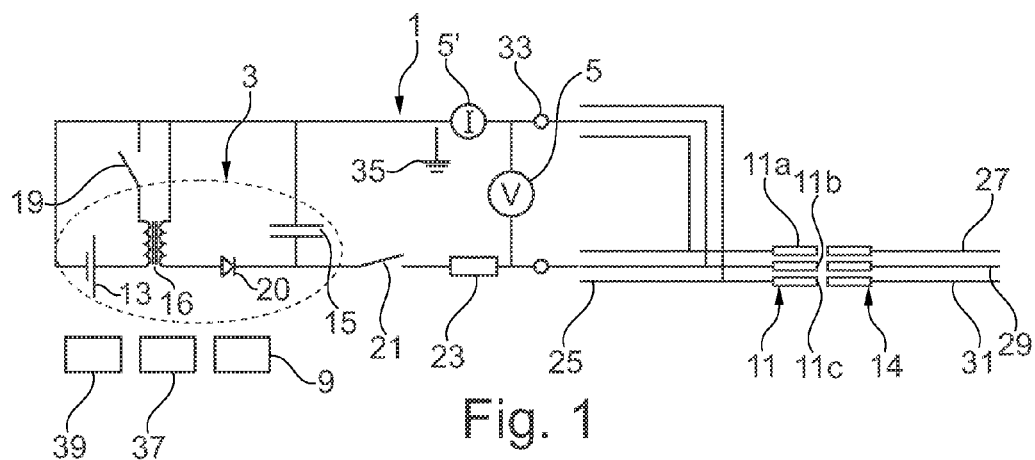
FIG. 1 is a schematic diagram illustrating an embodiment of an apparatus of the present disclosure.

In FIG. 1, a schematic diagram illustrates an embodiment of an apparatus of the present disclosure. The apparatus 1 comprises a voltage source 3 in the form of a DC voltage source 13 and a capacitor 15. The capacitor 15 can be charged by the voltage source 13 via an inductance 16 (e.g., a transformer) if a first switch 19 is repeatedly closed and opened. The opening and closing of the first switch 19 is controlled by a controller 9.

According to at least one embodiment of the present disclosure, the first switch 19 is driven by the controller 9 with a pulse width modulated signal, wherein the resulting amplitude of the output voltage of the voltage source 3 is defined by the pulse/pause relation of the pulse width modulation. In other embodiments, the voltage source 3 may be realized differently, e.g., by a DC voltage source only, a capacitor only, or by further combinations of voltage sources, inductances, and capacitors. According to one example of the present disclosure, the DC voltage source 13 may be provided in the form of a battery.

With the help of an optional second switch 21, the capacitor 15 may be electrically connected with connecting elements 11a, 11b, 11c via a second resistor 23 and a third switch 25. The second resistance helps reduce the current applied to an electrical supply network 14. This can reduce the risk of damaging appliances connected to the electrical supply network.

According to at least one embodiment, one or more resistors 23 are arranged in a serial connection to provide a desired resistance. The voltage source may be connected to each of the conductors of the electrical supply network by at least one resistor in the range of 10 kΩ to 150 kΩ. In at least one embodiment, the at least one resistor comprises a serial connection of multiple resistors having an overall resistance in the range of 10 kΩ to 15 kΩ. According to one embodiment, the resistor 23 has a resistance of approximately 50 kΩ, or the overall resistance of the serial connected resistors 23 does not exceed 50 kΩ. The dimensioning of the resistor 23 may depend on the dimensioning of the voltage source 3 and the desired output voltage of the voltage source 3.

With the help of the third switch 25, the voltage of the voltage source 3 can subsequently be applied to each of the connecting elements 11a, 11b, 11c. The second and the third switches 21, 25 are controlled by the controller 9.

In various embodiments, the apparatus 1 is connectable to an electrical supply network 14 comprising a phase conductor 27, a neutral conductor 29, and a protective earth conductor 31 by the three connecting elements 11a, 11b, 11c. According to an embodiment of the present disclosure, the three connecting elements 11a, 11b, 11c are arranged within an electric plug that is connectable with an electrical socket of the electrical supply network 14 (not shown).

With the help of the fourth switch 33, a measuring device 5, 5' can measure the resistance of a pair of conductors, e.g., conductors 11a and 11b, conductors 11a and 11c, or conductors 11b and 11c. For example, the measuring device 5, 5' can measure a voltage between a pair of the conductors as well as the current which flows through the pair of conductors. The controller 9 can also calculate the resistance based on the voltage and current measurements. Of course, the measuring device can determine the resistance by simply dividing the voltage by the current measured.

According to an embodiment of the present disclosure, the apparatus 1 may also comprise display elements 37, 39 for indicating whether an appliance is connected to the electrical supply network and for indicating whether the insulation resistance of one or each of the conductors of the electrical supply network is below or equal to the required threshold.

An operation of apparatus 1 is described below according to an embodiment of the present disclosure. The connecting elements 11a, 11b, 11c are connected with the conductors 27, 29, 31 of the electrical supply network 14. To determine whether appliances are connected to the supply network, the controller 9 operates the first switch 19 with a pulse width modulated signal to open and close alternately to charge the capacitor 15 and to provide the voltage required for measurement. The output voltage of the voltage source 3 is thereby defined by the pulse/pause relation of the pulse width modulation. The third switch 25 is operated by the controller 9 to electrically connect the capacitor 15 to the phase conductor 27 of the electrical supply network 14. At that point in time, a first voltage is applied to the phase conductor 27 and neutral conductor 29. The fourth switch 33 is operated by the controller 9 to allow the measuring device 5, 5' to determine the first resistance between the phase conductor 27 and the neutral conductor 29. Therefore, the measuring device 5, 5' is operated to measure the voltage between the pair of conductors 27, 29 and the current flow within the pair of conductors 27, 29. The measurement device 5, 5' has a typical voltage drop of less than 1 volt. This voltage drop is negligible compared to a higher test voltage of, e.g., 50 or more volts. If the first resistance is below or equal to a first threshold, the display element 37 may be operated to display to a user that one or more appliances are connected to the electrical supply network 14. In such case, an insulation test on the electrical supply network will not be conducted until the display element 37 indicates that no appliances are connected to the electrical supply network 14.

Modern electrical appliances are typically allowed to consume not more than 1 W while in a standby condition. A power of 1 W results in a load of about 50 kΩ, which is much lower than the required minimum insulation resistance of 500 kΩ. Therefore, according to at least one embodiment of the present disclosure, it can be advantageous to select the first threshold resistance value to be in a range of 10 kΩ to 250 kΩ. In various embodiments, the first threshold resistance value is selected to be in a range of 30 kΩ to 100 kΩ, and in some embodiments, the first threshold resistance value is selected to be 50 kΩ.

According to an embodiment of the present disclosure, the first voltage applied is a DC voltage in a range of 20V to 120V to one of the conductors of the electrical supply network. In various embodiments, the first voltage may be in a range of 30V to 100V, and in some embodiments, the first voltage may be 50V. Such voltages will not cause damage to connected appliances.

According to a further embodiment, when no electric appliances are detected, an insulation resistance test can subsequently be performed. A second voltage is applied to at least one pair of the conductors 27, 29, 31 of the electrical supply network 14 and a second resistance is measured between the pair of conductors 27, 29, 31. An insulation weakness of at least one of the conductors 27, 39, 31 is detected by comparing the second resistance to a predetermined second threshold resistance value and determining if the second resistance is lower than or equal to the predetermined second threshold resistance value. To apply a voltage to said pairs of conductors 27, 29, 31, the third and fourth switches 25, 33 are operated by the controller 9 similar to the operations described above. The third and fourth switches 25, 33 may be operated to allow a measurement of one or more pairs of the conductors 27, 29, 31, or in particular every pair of the conductors.

According to an embodiment of the present disclosure, it can be advantageous to operate the voltage source to apply a second voltage that is a DC voltage in a range of 250V to 2500V to a pair of the conductors 27, 29, 31 of the electrical supply network. In various embodiments, a second voltage in a range of 250V to 1000V is applied, and in some embodiments, the second voltage is 500V.

According to another embodiment of the present disclosure, the first threshold resistance value may be selected to be in a range of 500 kΩ to 10 MΩ. In some embodiments, the first threshold resistance value may be approximately 500 kΩ. Such resistance values are the minimum insulation resistance values required for typical electrical supply networks.

According to a further embodiment of the present disclosure, it can be advantageous to display whether an insulation weakness of one of the conductors 27, 29, 31 is detected, and in particular, an insulation weakness of each specific conductor 27, 29, 31. Such display may be achieved with the help of the display element 39.

Figure 2:
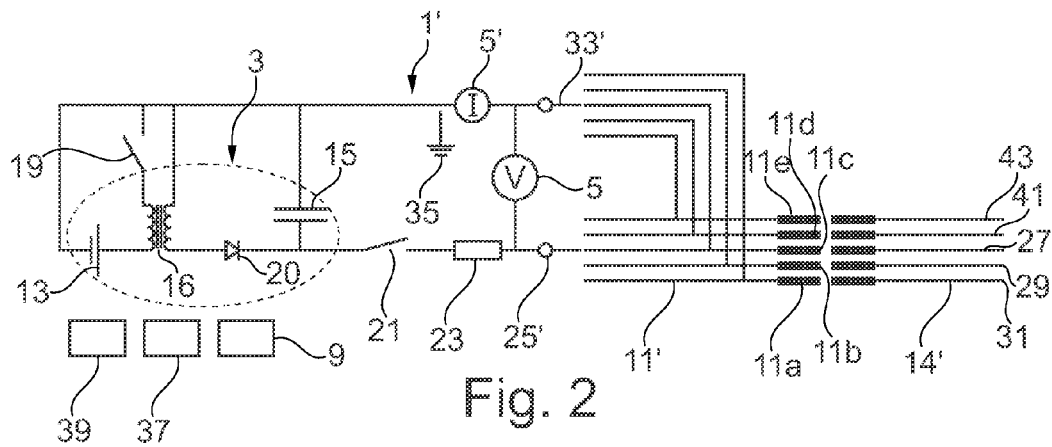
FIG. 2 is a schematic diagram illustrating another embodiment of an apparatus of the present disclosure.

In FIG. 2, an alternative embodiment of the present disclosure is shown. The apparatus 1' according to the embodiment shown is connectable with a three-phase current electrical supply network 14'. The differences with the embodiment outlined in FIG. 1 are the usage of two five-way switches 25', 33' to be able to apply a voltage to each pair of the five conductors 27, 29, 31, 41, 43 of the three-phase current electrical supply network. The general operation of the apparatus 1' according to FIG. 2 is similar to the operation of the apparatus 1 of FIG. 1.

Figure 3:
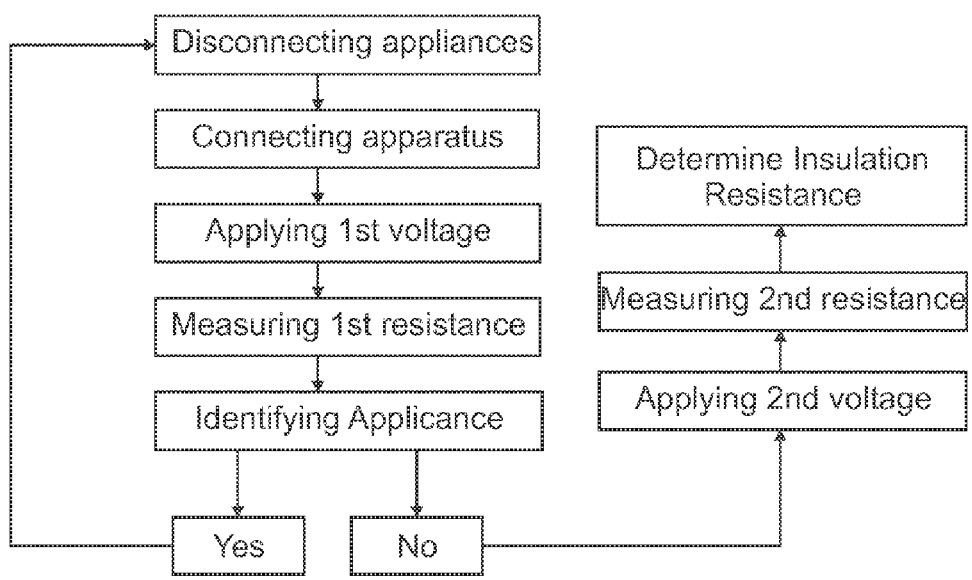
FIG. 3 is a block diagram illustrating an embodiment of a method of the present disclosure.

Turning now to FIG. 3, a schematic illustration of an embodiment of a method according to the present disclosure is shown. The method provides for operating an apparatus comprising a voltage source, a measuring device configured to measure a voltage and a current, a controller, and at least two connecting elements for detecting whether a device is connected to an electrical supply network and for detecting an insulation weakness of a pair of conductors of the supply network. In a first step, the method comprises switching off the main voltage of and disconnecting appliances connected to the electrical supply network to be tested. Afterwards, the apparatus is connected to the electrical supply network with the connecting elements. Alternatively, the appliances can be disconnected from the supply network after connecting the apparatus to the supply network, as long as the apparatus is operated only after disconnecting the appliances. In the next step, a first DC voltage of, e.g., approximately 50V is applied between the phase and neutral conductors of the electrical supply network, and a first resistance between said phase conductor and the neutral conductor of the electrical supply network is measured. If an electrical appliance remains connected to the electrical supply network, the appliance is detected by comparing the first resistance to a first threshold resistance value, e.g., 50 kΩ, and determining whether the first resistance is lower than or equal to the first threshold resistance value. Detection of an appliance still connected to the supply network can be displayed on a display element to a user so that the user can look for the appliance and disconnect the same. After disconnecting the remaining appliance(s), the first voltage may again be applied and it can again be detected whether further appliances are still connected to the electrical supply network.

If no electric device or appliance is detected, a second DC voltage of, e.g., 500V is subsequently applied to each pair of the conductors of the electrical supply network and a second resistance between each of the pairs of conductors is measured. An insulation weakness of at least one of the conductors is detected by comparing the second resistances to a second threshold resistance value, e.g., 500 kΩ, and determining whether at least one of the second resistances is lower than or equal to the second threshold resistance value. Optionally, a display element may display the detection of an insulation weakness of one of the conductors.

In further embodiments of the present disclosure, the first and second voltages as well as the first and second thresholds of resistance can differ from the exemplary values stated above. For beneficial values for the first and second voltages and the first and second thresholds of resistance, reference is made to the disclosure above as well as applicable standards, such as the ANSI/NETA ATS-2009 standard. Moreover, it is appreciated that the resistance of only one pair, or more than one pair, of conductors may be measured.

The embodiments of the invention in which an exclusive property or privilege is claimed are defined as follows:

1. An apparatus, comprising:
   a voltage source;
   a measuring device;
   a controller;
   a display element; and
   at least two connecting elements, wherein:
      the at least two connecting elements are connectable to an electrical supply network comprising at least a phase conductor and a neutral conductor;
      the voltage source is configured to apply at least a first voltage and a second voltage to a pair of the conductors of the electrical supply network, wherein the first voltage is different than the second voltage;
      the measuring device is configured to measure the resistance between the pair of conductors of the electrical supply network based on at least the first voltage or the second voltage and a current flow through the pair of conductors;
      the controller is configured to control the voltage source to apply the first voltage to the pair of conductors, compare a first resistance measured by the measuring device between the pair of conductors to a predetermined first threshold resistance value to determine if an electric device is connected to the electrical supply network, and detect an electric device connected to the electrical supply network as a result of determining that the first resistance is lower than or equal to the predetermined first threshold resistance value;
      in response to detecting an electrical device connected to the electrical supply network, the controller operates the display element to display to a user that an electric device is connected to the electrical supply network and, in such case, the controller is configured to not apply the second voltage to the pair of conductors of the electrical supply network until the display element indicates that no electric device is connected to the electrical supply network; and
      when the controller does not detect an electric device based on the comparison of the measured first resistance to the predetermined first threshold resistance value, the controller is further configured to control the voltage source to subsequently apply the second voltage to the pair of conductors of the electrical supply network, compare a second resistance measured by the measuring device to a predetermined second threshold resistance value to determine if an insulation weakness is present, and detect an insulation weakness of at least one of the conductors if the second resistance is lower than or equal to the predetermined second threshold resistance value.

2. The apparatus according to claim 1, wherein:
   the first voltage is in a range of 20V to 120V;
   the second voltage is in a range of 250V to 2500V; and
   the controller is configured to control the voltage source to vary the first and second voltage within said ranges stepwise or continuously.

3. The apparatus according to claim 1, wherein:
   the first threshold resistance value is in a range of 10 kΩ to 250 kΩ; and
   the second threshold resistance value is in a range of 500 kΩ to 10 MΩ.

4. The apparatus according to claim 1, wherein the voltage source comprises a battery, an inductance, at least one switch, and a capacitor, wherein:
   the battery is connected to the capacitor via the inductance, a diode, and the at least one switch;
   the at least one switch is configured to connect or disconnect the battery and the capacitor; and
   the at least one switch is driven by the controller using a pulse width modulated signal to repeatedly close and open the at least one switch to provide the first voltage or the second voltage.

5. The apparatus according to claim 1, wherein the voltage source is connected to each of the conductors of the electrical supply network by at least one resistor in the range of 10 kΩ to 150 kΩ.

6. The apparatus according to claim 5, wherein the at least one resistor comprises a serial connection of multiple resistors having an overall resistance in the range of 10 kΩ to 150 kΩ.

7. The apparatus according to claim 1, wherein the controller is configured to subsequently apply the second voltage to different pairs of the conductors of the electrical supply network and to compare the second resistances measured by the measuring device between each pair of the conductors to the predetermined second threshold resistance value, and to detect an insulation weakness of the conductors if any of the second resistances is lower than or equal to the predetermined second threshold resistance value.

8. The apparatus according to claim 1, wherein, based on the comparison of the second resistance measured by the measuring device to the predetermined second threshold resistance value, the display element is configured to display whether an insulation weakness of one of the conductors is detected.

9. The apparatus according to claim 8, wherein the display element is further configured to display an insulation weakness of a specific conductor of the conductors of the electrical supply network.

10. The apparatus according to claim 1, wherein the electrical supply network further comprises a protective earth conductor.

11. An apparatus, comprising:
   a voltage source;
   a measuring device;
   a controller;
   a display element; and
   three connecting elements, wherein:
      the three connecting elements are connectable to an electrical supply network comprising a phase conductor, a neutral conductor, and a protective earth conductor;

the voltage source is configured to apply at least a first voltage and a second voltage to at least one pair of the conductors of the electrical supply network, wherein the first voltage is approximately 50V and the second voltage is approximately 500V;

the measuring device is configured to measure the resistance between the pair of conductors of the electrical supply network based on at least the first voltage or the second voltage and a current flow through the pair of conductors;

the controller is configured to control the voltage source to apply the first voltage to the pair of conductors, compare a first resistance measured by the measuring device between the pair of conductors to a predetermined first threshold resistance value of approximately 50 kΩ to determine if an electric device is connected to the electrical supply network, and detect an electric device connected to the electrical supply network when the first resistance is determined to be lower than or equal to the first threshold resistance value;

in response to detecting an electrical device connected to the electrical supply network, the controller operates the display element to display to a user that an electric device is connected to the electrical supply network and, in such case, the controller is configured to not apply the second voltage to the pair of conductors of the electrical supply network until the display element indicates that no electric device is connected to the electrical supply network; and when the controller does not detect an electric device based on the comparison of the measured first resistance to the predetermined first threshold resistance value, the controller is further configured to control the voltage source to subsequently apply the second voltage to the pair of conductors of the electrical supply network, compare a second resistance measured by the measuring device to a predetermined second threshold resistance value of approximately 500 kΩ, and detect an insulation weakness of at least one of the conductors if the second resistance is lower than or equal to approximately 50 kΩ.

12. The apparatus according to claim 1, wherein:

the at least two connecting elements are three connecting elements that are connectable to an electrical supply network comprising a phase conductor, a neutral conductor, and a protective earth conductor;

the voltage source comprises a battery, a transformer, at least one switch, and a capacitor, wherein the battery is connected to the capacitor via the transformer, a diode, and the at least one switch, wherein the at least one switch is configured to connect or disconnect the battery and the capacitor, and wherein the voltage source is configured to apply at least the first voltage to at least one pair of the conductors of the electrical supply network, the first voltage being in a range of 20V to 120V; and the controller is configured to control the voltage source to apply the first voltage to the pair of conductors by driving the at least one switch using a pulse width modulated signal to repeatedly close and open the at least one switch; and the predetermined first threshold resistance value is in a range of 10 kΩ to 250 kΩ.

13. A method of operating an apparatus, the method comprising:

connecting at least two connecting elements of the apparatus to an electrical supply network comprising at least a phase conductor and a neutral conductor, wherein the apparatus includes a voltage source, a measuring device, a controller, a display element, and the at least two connecting elements, wherein the voltage source is configured to apply at least a first voltage and a second voltage to a pair of the conductors of the electrical supply network, the first voltage being different than the second voltage, and wherein the measuring device is configured to measure a resistance between the pair of conductors of the electrical supply network based on at least the first voltage or the second voltage and a current flow through the pair of conductors;

applying a first voltage to the pair of the conductors of the electrical supply network and measuring a first resistance between the pair of conductors;

detecting, by the controller, an electrical device connected to the electrical supply network by comparing the first resistance to a predetermined first threshold resistance value and determining whether the first resistance is lower than or equal to the predetermined first threshold resistance value;

in response to the controller detecting an electrical device connected to the electrical supply network, operating the display element to display to a user that an electric device is connected to the electrical supply network, wherein in such case the controller does not cause the voltage source to apply the second voltage to the pair of conductors of the electrical supply network until the display element indicates that no electric device is connected to the electrical supply network;

if the controller does not detect an electric device based on the comparison of the measured first resistance to the predetermined first threshold resistance value, then subsequently applying the second voltage to the pair of conductors of the electrical supply network and measuring a second resistance between the pair of conductors; and detecting, by the controller, an insulation weakness of at least one of the conductors by comparing the second resistance to a predetermined second threshold resistance value and determining whether the second resistance is lower than or equal to the predetermined second threshold resistance value.

14. The method according to claim 13, wherein the first voltage is in a range of 20V to 120V, and the second voltage is in a range of 250V to 2500V, the method further comprising varying the first voltage and the second voltage within said ranges stepwise or continuously.

15. The method according to claim 13, further comprising selecting the first threshold resistance value to be in a range of 10 kΩ to 250 kΩ, and selecting the second threshold resistance value to be in a range of 500 kΩ to 10 MΩ.

16. The method according to claim 13, further comprising:

applying the second voltage to each pair of conductors of the electrical supply network and measuring a respective second resistance between each pair of conductors; and detecting an insulation weakness of each of the conductors by comparing the second resistance to the predetermined second threshold resistance value and determining whether the second resistance is lower than or equal to the predetermined second threshold resistance value.

17. The method according to claim 13, further comprising operating the display element to display a detection of an insulation weakness of at least one of the conductors based on the comparison of the second resistance measured by the measuring device to the predetermined second threshold resistance value.

18. The method according to claim 17, wherein operating the display element comprises displaying an insulation weakness of a specific conductor of the conductors of the electrical supply network.

19. The method according to claim 13, wherein the first voltage is approximately 50V, the predetermined first threshold resistance is approximately 50 k$\Omega$, the second voltage is approximately 500V, and the predetermined second threshold resistance value is approximately 500 k$\Omega$.

* * * * *